US009100132B2

(12) United States Patent
Kolessar et al.

(10) Patent No.: US 9,100,132 B2
(45) Date of Patent: *Aug. 4, 2015

(54) SYSTEMS AND METHODS FOR GATHERING AUDIENCE MEASUREMENT DATA

(75) Inventors: Ronald S. Kolessar, Elkridge, MD (US); James M. Jensen, Columbia, MD (US); Wendell D. Lynch, Silver Spring, MD (US)

(73) Assignee: The Nielsen Company (US), LLC, New York, NY (US)

( * ) Notice: Subject to any disclaimer, the term of this patent is extended or adjusted under 35 U.S.C. 154(b) by 406 days.

This patent is subject to a terminal disclaimer.

(21) Appl. No.: 12/611,220

(22) Filed: Nov. 3, 2009

(65) Prior Publication Data

US 2010/0049474 A1 Feb. 25, 2010

Related U.S. Application Data

(63) Continuation of application No. 11/767,254, filed on Jun. 22, 2007, now Pat. No. 7,640,141, which is a continuation of application No. 10/205,808, filed on Jul. 26, 2002, now Pat. No. 7,239,981.

(51) Int. Cl.
*H03F 1/26* (2006.01)
*H04H 60/31* (2008.01)

(52) U.S. Cl.
CPC .................................... *H04H 60/31* (2013.01)

(58) Field of Classification Search
CPC .... G06F 17/18; G01B 11/24; G06K 9/00536; H03M 1/121
USPC ............ 702/189; 704/500; 386/46; 709/231; 700/94; 725/9; 379/413
See application file for complete search history.

(56) References Cited

U.S. PATENT DOCUMENTS

| | | | |
|---|---|---|---|
| 2,833,859 | A | 5/1958 | Rahmel et al. |
| 3,484,787 | A | 12/1969 | Vallese |
| 3,540,003 | A | 11/1970 | Murphy |
| 3,818,458 | A | 6/1974 | Deese |
| 3,906,450 | A | 9/1975 | Prado, Jr. |
| 3,906,454 | A | 9/1975 | Martin |

(Continued)

FOREIGN PATENT DOCUMENTS

| | | |
|---|---|---|
| AU | 8976601 | 2/2002 |
| AU | 9298201 | 4/2002 |

(Continued)

OTHER PUBLICATIONS

Heuer, et al., "Adaptive Multimedia Messaging based on MPEG-7—The M3-Box," Nov. 9-10, 2000, Proc. Second Int'l Symposium on Mobile Multimedia Systems Applications, pp. 6-13 (8 pages).

(Continued)

*Primary Examiner* — Tung S Lau
*Assistant Examiner* — Xiuquin Sun
(74) *Attorney, Agent, or Firm* — Hanley, Flight & Zimmerman, LLC

(57) ABSTRACT

Systems and methods are provided for gathering audience measurement data relating to exposure of an audience member to audio data. Audio data is received in a user system and is then encoded with audience measurement data. The encoded audio data is reproduced by the user system, picked up by a monitor and decoded to recover the audience measurement data.

19 Claims, 2 Drawing Sheets

(56) References Cited

U.S. PATENT DOCUMENTS 3,919,479 A 11/1975 Moon et al.
3,973,206 A 8/1976 Haselwood et al.
T955,010 I4 2/1977 Ragonese et al.
4,048,562 A 9/1977 Haselwood et al.
4,168,396 A 9/1979 Best
4,230,990 A 10/1980 Lert, Jr. et al.
4,232,193 A 11/1980 Gerard
4,306,289 A 12/1981 Lumley
4,319,079 A 3/1982 Best
4,361,832 A 11/1982 Cole
4,367,488 A 1/1983 Leventer et al.
4,367,525 A 1/1983 Brown et al.
4,425,578 A 1/1984 Haselwood et al.
4,547,804 A 10/1985 Greenberg
4,558,413 A 12/1985 Schmidt et al.
4,588,991 A 5/1986 Atalla
4,590,550 A 5/1986 Eilert et al.
4,595,950 A 6/1986 Lofberg
4,621,325 A 11/1986 Naftzger et al.
4,630,196 A 12/1986 Bednar, Jr. et al.
4,639,779 A 1/1987 Greenberg
4,647,974 A 3/1987 Butler et al.
4,658,093 A 4/1987 Hellman
4,672,572 A 6/1987 Alsberg
4,677,466 A 6/1987 Lert, Jr. et al.
4,685,056 A 8/1987 Barnsdale, Jr. et al.
4,694,490 A 9/1987 Harvey et al.
4,696,034 A 9/1987 Wiedemer
4,697,209 A 9/1987 Kiewit et al.
4,703,324 A 10/1987 White
4,712,097 A 12/1987 Hashimoto
4,718,005 A 1/1988 Feigenbaum et al.
4,720,782 A 1/1988 Kovalcin
4,723,302 A 2/1988 Fulmer et al.
4,734,865 A 3/1988 Scullion et al.
4,739,398 A 4/1988 Thomas et al.
4,740,890 A 4/1988 William
4,745,468 A 5/1988 Von Kohorn
4,747,139 A 5/1988 Taaffe
4,754,262 A 6/1988 Hackett et al.
4,757,533 A 7/1988 Allen et al.
4,764,808 A 8/1988 Solar
4,769,697 A 9/1988 Gilley et al.
4,791,565 A 12/1988 Dunham et al.
4,805,020 A 2/1989 Greenberg
4,821,178 A 4/1989 Levin et al.
4,825,354 A 4/1989 Agrawal et al.
4,827,508 A 5/1989 Shear
4,866,769 A 9/1989 Karp
4,876,592 A 10/1989 Von Kohorn
4,876,736 A 10/1989 Kiewit
4,907,079 A * 3/1990 Turner et al. .................... 725/11
4,914,689 A 4/1990 Quade et al.
4,926,162 A 5/1990 Pickell
4,926,255 A 5/1990 Von Kohorn
4,930,011 A 5/1990 Kiewit
4,931,871 A 6/1990 Kramer
4,940,976 A 7/1990 Gastouniotis et al.
4,943,963 A 7/1990 Waechter et al.
4,945,412 A 7/1990 Kramer
4,956,769 A 9/1990 Smith
4,967,273 A 10/1990 Greenberg
4,970,644 A 11/1990 Berneking et al.
4,972,503 A 11/1990 Zurlinden
4,973,952 A 11/1990 Malec et al.
4,977,594 A 12/1990 Shear
4,994,916 A 2/1991 Pshitssky et al.
5,019,899 A 5/1991 Boles et al.
5,023,907 A 6/1991 Johnson et al.
5,023,929 A 6/1991 Call
5,032,979 A 7/1991 Hecht et al.
5,034,807 A 7/1991 Von Kohorn
5,057,915 A 10/1991 Von Kohorn
5,081,680 A 1/1992 Bennett
5,086,386 A 2/1992 Islam
5,103,498 A 4/1992 Lanier et al.
5,113,518 A 5/1992 Durst, Jr. et al.
5,128,752 A 7/1992 Von Kohorn
5,157,489 A 10/1992 Lowe
5,182,770 A 1/1993 Medveczky et al.
5,200,822 A 4/1993 Bronfin et al.
5,204,897 A 4/1993 Wyman
5,214,780 A 5/1993 Ingoglia et al.
5,222,874 A 6/1993 Unnewehr et al.
5,227,874 A 7/1993 Von Kohorn
5,233,642 A 8/1993 Renton
5,249,044 A 9/1993 Von Kohorn
5,283,734 A 2/1994 Von Kohorn
5,287,408 A 2/1994 Samson
5,317,635 A 5/1994 Stirling et al.
5,319,735 A 6/1994 Preuss et al.
5,331,544 A 7/1994 Lu et al.
5,343,239 A 8/1994 Lappington et al.
5,355,484 A 10/1994 Record et al.
5,374,951 A 12/1994 Welsh
5,377,269 A 12/1994 Heptig et al.
5,388,211 A 2/1995 Hornbuckle
5,401,946 A 3/1995 Weinblatt
5,406,269 A 4/1995 Baran
5,410,598 A 4/1995 Shear
5,425,100 A 6/1995 Thomas et al.
5,440,738 A 8/1995 Bowman et al.
5,444,642 A 8/1995 Montgomery et al.
5,450,134 A 9/1995 Legate
5,450,490 A 9/1995 Jensen et al.
5,457,807 A 10/1995 Weinblatt
5,463,616 A 10/1995 Kruse et al.
5,481,294 A 1/1996 Thomas et al.
5,483,276 A 1/1996 Brooks et al.
5,483,658 A 1/1996 Grube et al.
5,488,648 A 1/1996 Womble
5,490,060 A 2/1996 Malec et al.
5,497,479 A 3/1996 Hornbuckle
5,499,340 A 3/1996 Barritz
5,508,731 A 4/1996 Von Kohorn
5,512,933 A 4/1996 Wheatley et al.
5,519,433 A 5/1996 Lappington et al.
5,524,195 A 6/1996 Clanton, III et al.
5,526,035 A 6/1996 Lappington et al.
5,533,021 A 7/1996 Branstad et al.
5,543,856 A 8/1996 Rosser et al.
5,557,334 A 9/1996 Legate
5,559,808 A 9/1996 Kostreski et al.
5,561,010 A 10/1996 Hanyu et al.
5,574,962 A * 11/1996 Fardeau et al. .............. 455/2.01
5,579,124 A 11/1996 Aijala et al.
5,581,800 A 12/1996 Fardeau et al.
5,584,025 A 12/1996 Keithley et al.
5,584,050 A 12/1996 Lyons
5,594,934 A 1/1997 Lu et al.
5,606,604 A 2/1997 Rosenblatt et al.
5,610,916 A 3/1997 Kostreski et al.
5,621,395 A 4/1997 Kiyaji et al.
5,629,739 A 5/1997 Dougherty
5,638,113 A 6/1997 Lappington et al.
5,640,192 A 6/1997 Garfinkle
5,646,675 A 7/1997 Copriviza et al.
5,646,942 A 7/1997 Oliver et al.
5,654,748 A 8/1997 Matthews, III
5,659,366 A 8/1997 Kerman
5,666,293 A 9/1997 Metz et al.
5,666,365 A 9/1997 Kostreski
5,675,510 A 10/1997 Coffey et al.
5,682,196 A 10/1997 Freeman
5,697,844 A 12/1997 Von Kohorn
5,701,582 A 12/1997 DeBey
5,713,795 A 2/1998 Von Kohorn
5,719,634 A 2/1998 Keery et al.
5,724,103 A 3/1998 Batchelor
5,724,521 A 3/1998 Dedrick
5,727,129 A 3/1998 Barett et al.
5,729,472 A 3/1998 Seiffert et al.
5,729,549 A 3/1998 Kostreski et al.
5,732,218 A 3/1998 Bland et al.

(56) References Cited

U.S. PATENT DOCUMENTS

| | | | | |
|---|---|---|---|---|
| 5,734,413 | A | 3/1998 | Lappington et al. | |
| 5,734,720 | A | 3/1998 | Salganicoff | |
| 5,740,035 | A | 4/1998 | Cohen et al. | |
| 5,740,549 | A | 4/1998 | Reilly et al. | |
| 5,745,760 | A | 4/1998 | Kawamura et al. | |
| 5,751,707 | A | 5/1998 | Voit et al. | |
| 5,754,938 | A | 5/1998 | Herz et al. | |
| 5,754,939 | A | 5/1998 | Herz et al. | |
| 5,758,257 | A | 5/1998 | Herz et al. | |
| 5,759,101 | A | 6/1998 | Von Kohorn | |
| 5,761,606 | A | 6/1998 | Wolzien | |
| 5,764,275 | A | 6/1998 | Lappington et al. | |
| 5,764,763 | A | 6/1998 | Jensen et al. | |
| 5,768,382 | A | 6/1998 | Schneier et al. | |
| 5,768,680 | A | 6/1998 | Thomas | |
| 5,771,354 | A | 6/1998 | Crawford | |
| 5,774,664 | A | 6/1998 | Hidary et al. | |
| 5,787,253 | A | 7/1998 | McCreery et al. | |
| 5,787,334 | A | 7/1998 | Fardeau et al. | |
| 5,793,410 | A | 8/1998 | Rao | |
| 5,796,633 | A | 8/1998 | Burgess et al. | |
| 5,796,952 | A | 8/1998 | Davis et al. | |
| 5,802,304 | A | 9/1998 | Stone | |
| 5,812,928 | A | 9/1998 | Watson, Jr. et al. | |
| 5,815,671 | A | 9/1998 | Morrison | |
| 5,819,156 | A | 10/1998 | Belmont | |
| 5,828,325 | A | 10/1998 | Wolosewicz et al. | |
| 5,833,468 | A | 11/1998 | Guy et al. | |
| 5,841,978 | A | 11/1998 | Rhoads | |
| 5,848,155 | A | 12/1998 | Cox | |
| 5,848,396 | A | 12/1998 | Gerace | |
| 5,850,249 | A | 12/1998 | Massetti et al. | |
| 5,857,190 | A | 1/1999 | Brown | |
| 5,872,588 | A | 2/1999 | Aras et al. | |
| 5,878,384 | A | 3/1999 | Johnson et al. | |
| 5,880,789 | A | 3/1999 | Inaba | |
| 5,887,140 | A | 3/1999 | Itsumi et al. | |
| 5,892,917 | A | 4/1999 | Myerson | |
| 5,893,067 | A | 4/1999 | Bender et al. | |
| 5,905,713 | A | 5/1999 | Anderson et al. | |
| 5,918,223 | A | 6/1999 | Blum et al. | |
| 5,930,369 | A | 7/1999 | Cox et al. | |
| 5,933,789 | A | 8/1999 | Byun et al. | |
| 5,937,392 | A | 8/1999 | Alberts | |
| 5,944,780 | A | 8/1999 | Chase et al. | |
| 5,945,932 | A | 8/1999 | Smith et al. | |
| 5,945,988 | A | 8/1999 | Williams et al. | |
| 5,951,642 | A | 9/1999 | Onoe et al. | |
| 5,956,716 | A | 9/1999 | Kenner et al. | |
| 5,966,120 | A | 10/1999 | Arazi et al. | |
| 5,974,396 | A | 10/1999 | Anderson et al. | |
| 5,978,842 | A | 11/1999 | Noble et al. | |
| 5,987,611 | A | 11/1999 | Freund | |
| 5,987,855 | A | 11/1999 | Dey et al. | |
| 5,991,807 | A | 11/1999 | Schmidt et al. | |
| 5,999,912 | A | 12/1999 | Wodarz et al. | |
| 6,006,217 | A | 12/1999 | Lumsden | |
| 6,006,332 | A | 12/1999 | Rabne et al. | |
| 6,018,619 | A | 1/2000 | Allard et al. | |
| 6,034,722 | A | 3/2000 | Viney et al. | |
| 6,035,177 | A | 3/2000 | Moses et al. | |
| 6,049,830 | A | 4/2000 | Saib | |
| 6,055,573 | A | 4/2000 | Gardenswartz et al. | |
| 6,061,082 | A | 5/2000 | Park | |
| 6,061,719 | A | 5/2000 | Bendinelli et al. | |
| 6,108,637 | A | 8/2000 | Blumenau | |
| 6,115,680 | A | 9/2000 | Coffee et al. | |
| 6,138,155 | A | 10/2000 | Davis et al. | |
| 6,154,209 | A | 11/2000 | Naughton et al. | |
| 6,154,484 | A | 11/2000 | Lee et al. | |
| 6,175,627 | B1 | 1/2001 | Petrovic et al. | |
| 6,199,206 | B1 | 3/2001 | Nichioka et al. | |
| 6,202,210 | B1 | 3/2001 | Ludtke | |
| 6,208,735 | B1 | 3/2001 | Cox et al. | |
| 6,216,129 | B1 | 4/2001 | Eldering | |
| 6,272,176 | B1 | 8/2001 | Srinivasan | |
| 6,286,036 | B1 | 9/2001 | Rhoads | |
| 6,286,140 | B1 | 9/2001 | Ivanyi | |
| 6,298,348 | B1 | 10/2001 | Eldering | |
| 6,308,327 | B1 | 10/2001 | Liu et al. | |
| 6,327,619 | B1 | 12/2001 | Blumenau | |
| 6,331,876 | B1 | 12/2001 | Koster et al. | |
| 6,335,736 | B1 | 1/2002 | Wagner et al. | |
| 6,363,159 | B1 | 3/2002 | Rhoads | |
| 6,381,632 | B1 | 4/2002 | Lowell | |
| 6,389,055 | B1 | 5/2002 | August et al. | |
| 6,400,827 | B1 | 6/2002 | Rhoads | |
| 6,411,725 | B1 | 6/2002 | Rhoads | |
| 6,421,445 | B1 | 7/2002 | Jensen et al. | |
| 6,477,707 | B1 | 11/2002 | King et al. | |
| 6,487,564 | B1 | 11/2002 | Asai et al. | |
| 6,505,160 | B1 | 1/2003 | Levy et al. | |
| 6,510,462 | B2 | 1/2003 | Blumenau | |
| 6,512,836 | B1 | 1/2003 | Xie et al. | |
| 6,513,014 | B1 | 1/2003 | Walker et al. | |
| 6,522,771 | B2 | 2/2003 | Rhoads | |
| 6,539,095 | B1 | 3/2003 | Rhoads | |
| 6,546,556 | B1 | 4/2003 | Kataoka et al. | |
| 6,553,178 | B2 | 4/2003 | Abecassis | |
| 6,574,594 | B2 | 6/2003 | Pitman et al. | |
| 6,642,966 | B1 | 11/2003 | Limaye | |
| 6,647,269 | B2 | 11/2003 | Hendrey et al. | |
| 6,651,253 | B2 | 11/2003 | Dudkiewicz et al. | |
| 6,654,480 | B2 | 11/2003 | Rhoads | |
| 6,665,873 | B1 | 12/2003 | Van Gestel et al. | |
| 6,675,383 | B1 | 1/2004 | Wheeler et al. | |
| 6,683,966 | B1 | 1/2004 | Tian et al. | |
| 6,710,815 | B1 | 3/2004 | Billmaier et al. | |
| 6,714,683 | B1 | 3/2004 | Tian et al. | |
| 6,741,684 | B2 | 5/2004 | Kaars | |
| 6,748,362 | B1 * | 6/2004 | Meyer et al. | 704/500 |
| 6,750,985 | B2 | 6/2004 | Rhoads | |
| 6,766,523 | B2 | 7/2004 | Herley | |
| 6,795,972 | B2 | 9/2004 | Rovira | |
| 6,804,379 | B2 | 10/2004 | Rhoads | |
| 6,829,368 | B2 | 12/2004 | Meyer et al. | |
| 6,853,634 | B1 | 2/2005 | Davies et al. | |
| 6,871,180 | B1 | 3/2005 | Neuhauser et al. | |
| 6,871,323 | B2 | 3/2005 | Wagner et al. | |
| 6,873,688 | B1 | 3/2005 | Aarnio | |
| 6,941,275 | B1 | 9/2005 | Swierczek | |
| 6,956,575 | B2 | 10/2005 | Nakazawa et al. | |
| 6,965,601 | B1 | 11/2005 | Nakano et al. | |
| 6,968,564 | B1 | 11/2005 | Srinivasan | |
| 6,970,886 | B1 | 11/2005 | Conwell et al. | |
| 6,996,213 | B1 | 2/2006 | De Jong | |
| 7,003,731 | B1 | 2/2006 | Rhaods et al. | |
| 7,050,603 | B2 | 5/2006 | Rhoads et al. | |
| 7,051,086 | B2 | 5/2006 | Rhoads et al. | |
| 7,058,697 | B2 | 6/2006 | Rhoads | |
| 7,082,434 | B2 | 7/2006 | Gosselin | |
| 7,095,871 | B2 | 8/2006 | Jones et al. | |
| 7,143,949 | B1 | 12/2006 | Hannigan | |
| 7,158,943 | B2 | 1/2007 | Ven der Riet | |
| 7,171,018 | B2 | 1/2007 | Rhoads et al. | |
| 7,174,293 | B2 | 2/2007 | Kenyon et al. | |
| 7,185,201 | B2 | 2/2007 | Rhoads et al. | |
| 7,194,752 | B1 | 3/2007 | Kenyon et al. | |
| 7,197,156 | B1 | 3/2007 | Levy | |
| 7,206,494 | B2 | 4/2007 | Engle et al. | |
| 7,215,280 | B1 | 5/2007 | Percy et al. | |
| 7,221,405 | B2 | 5/2007 | Basson et al. | |
| 7,227,972 | B2 | 6/2007 | Brundage et al. | |
| 7,239,981 | B2 | 7/2007 | Kolessar et al. | |
| 7,254,249 | B2 | 8/2007 | Rhoads et al. | |
| 7,273,978 | B2 | 9/2007 | Uhle | |
| 7,317,716 | B1 | 1/2008 | Boni et al. | |
| 7,328,153 | B2 | 2/2008 | Wells et al. | |
| 7,346,512 | B2 | 3/2008 | Li-Chun Wang et al. | |
| 7,356,700 | B2 | 4/2008 | Noridomi et al. | |
| 7,363,278 | B2 | 4/2008 | Schmelzer et al. | |
| 7,369,678 | B2 | 5/2008 | Rhoads | |
| 7,421,723 | B2 | 9/2008 | Harkness et al. | |
| 7,440,674 | B2 | 10/2008 | Plotnick et al. | |

(56) References Cited

U.S. PATENT DOCUMENTS

| | | | |
|---|---|---|---|
| 7,443,292 | B2 | 10/2008 | Jensen et al. |
| 7,463,143 | B2 | 12/2008 | Forr et al. |
| 7,519,658 | B1 | 4/2009 | Anglin et al. |
| 7,592,908 | B2 | 9/2009 | Zhang et al. |
| 7,607,147 | B1 | 10/2009 | Lu et al. |
| 7,623,823 | B2 | 11/2009 | Zito et al. |
| 7,640,141 | B2 * | 12/2009 | Kolessar et al. .............. 702/189 |
| 7,644,422 | B2 | 1/2010 | Lu et al. |
| RE42,627 | E | 8/2011 | Neuhauser et al. |
| 8,369,972 | B2 | 2/2013 | Topchy et al. |
| 2001/0028662 | A1 | 10/2001 | Hunt et al. |
| 2001/0044751 | A1 | 11/2001 | Pugliese et al. |
| 2001/0044899 | A1 | 11/2001 | Levy |
| 2001/0047517 | A1 | 11/2001 | Christopoulos et al. |
| 2001/0056405 | A1 | 12/2001 | Muyres et al. |
| 2001/0056573 | A1 | 12/2001 | Kovac et al. |
| 2002/0002488 | A1 | 1/2002 | Muyres et al. |
| 2002/0032734 | A1 | 3/2002 | Rhoads |
| 2002/0032904 | A1 | 3/2002 | Lerner |
| 2002/0033842 | A1 | 3/2002 | Zetts |
| 2002/0053078 | A1 | 5/2002 | Holtz et al. |
| 2002/0056086 | A1 | 5/2002 | Yuen |
| 2002/0056089 | A1 | 5/2002 | Houston |
| 2002/0056094 | A1 | 5/2002 | Dureau |
| 2002/0059218 | A1 | 5/2002 | August et al. |
| 2002/0062382 | A1 | 5/2002 | Rhoads et al. |
| 2002/0065826 | A1 | 5/2002 | Bell et al. |
| 2002/0087967 | A1 | 7/2002 | Conkwright et al. |
| 2002/0087969 | A1 | 7/2002 | Brunheroto et al. |
| 2002/0091991 | A1 | 7/2002 | Castro |
| 2002/0101083 | A1 | 8/2002 | Toledano et al. |
| 2002/0102993 | A1 | 8/2002 | Hendrey et al. |
| 2002/0108125 | A1 | 8/2002 | Joao |
| 2002/0111934 | A1 | 8/2002 | Narayan |
| 2002/0112002 | A1 | 8/2002 | Abato |
| 2002/0124077 | A1 * | 9/2002 | Hill et al. ...................... 709/224 |
| 2002/0124246 | A1 | 9/2002 | Kaminsky et al. |
| 2002/0133412 | A1 | 9/2002 | Oliver et al. |
| 2002/0138851 | A1 | 9/2002 | Lord et al. |
| 2002/0144262 | A1 | 10/2002 | Plotnick et al. |
| 2002/0144273 | A1 | 10/2002 | Reto |
| 2002/0162118 | A1 | 10/2002 | Levy et al. |
| 2002/0171567 | A1 | 11/2002 | Altare et al. |
| 2002/0174425 | A1 | 11/2002 | Markel et al. |
| 2002/0188746 | A1 | 12/2002 | Drosset et al. |
| 2002/0194592 | A1 | 12/2002 | Tsuchida et al. |
| 2003/0021441 | A1 | 1/2003 | Levy et al. |
| 2003/0039465 | A1 | 2/2003 | Bjorgan et al. |
| 2003/0041141 | A1 | 2/2003 | Abdelaziz et al. |
| 2003/0056208 | A1 | 3/2003 | Kamada et al. |
| 2003/0070167 | A1 | 4/2003 | Holtz et al. |
| 2003/0088674 | A1 | 5/2003 | Ullman et al. |
| 2003/0105870 | A1 | 6/2003 | Baum |
| 2003/0108200 | A1 | 6/2003 | Sako |
| 2003/0115586 | A1 | 6/2003 | Lejouan et al. |
| 2003/0115598 | A1 | 6/2003 | Pantoja |
| 2003/0170001 | A1 | 9/2003 | Breen |
| 2003/0171833 | A1 | 9/2003 | Crystal et al. |
| 2003/0177488 | A1 | 9/2003 | Smith et al. |
| 2003/0185232 | A1 | 10/2003 | Moore et al. |
| 2003/0229900 | A1 | 12/2003 | Reisman |
| 2004/0004630 | A1 | 1/2004 | Kalva et al. |
| 2004/0006696 | A1 | 1/2004 | Shin et al. |
| 2004/0024588 | A1 | 2/2004 | Watson et al. |
| 2004/0031058 | A1 | 2/2004 | Reisman |
| 2004/0037271 | A1 | 2/2004 | Liscano et al. |
| 2004/0038692 | A1 | 2/2004 | Muzaffar |
| 2004/0059918 | A1 | 3/2004 | Xu |
| 2004/0059933 | A1 | 3/2004 | Levy |
| 2004/0064319 | A1 | 4/2004 | Neuhauser et al. |
| 2004/0073916 | A1 | 4/2004 | Petrovic et al. |
| 2004/0073951 | A1 | 4/2004 | Bae et al. |
| 2004/0120417 | A1 | 6/2004 | Lynch et al. |
| 2004/0125125 | A1 | 7/2004 | Levy |
| 2004/0128514 | A1 | 7/2004 | Rhoads |
| 2004/0137929 | A1 | 7/2004 | Jones et al. |
| 2004/0143844 | A1 | 7/2004 | Brant et al. |
| 2004/0146161 | A1 | 7/2004 | De Jong |
| 2004/0184369 | A1 | 9/2004 | Herre et al. |
| 2004/0199387 | A1 | 10/2004 | Wang et al. |
| 2004/0267533 | A1 | 12/2004 | Hannigan et al. |
| 2005/0028189 | A1 | 2/2005 | Heine et al. |
| 2005/0033758 | A1 | 2/2005 | Baxter |
| 2005/0036653 | A1 | 2/2005 | Brundage et al. |
| 2005/0058319 | A1 | 3/2005 | Rhoads et al. |
| 2005/0086682 | A1 | 4/2005 | Burges et al. |
| 2005/0144004 | A1 | 6/2005 | Bennett et al. |
| 2005/0192933 | A1 | 9/2005 | Rhoads et al. |
| 2005/0216346 | A1 | 9/2005 | Kusumoto et al. |
| 2005/0232411 | A1 * | 10/2005 | Srinivasan et al. ............ 379/413 |
| 2005/0234728 | A1 | 10/2005 | Tachibana et al. |
| 2005/0234774 | A1 | 10/2005 | Dupree |
| 2005/0262351 | A1 | 11/2005 | Levy |
| 2005/0271246 | A1 | 12/2005 | Sharma et al. |
| 2006/0059277 | A1 | 3/2006 | Zito et al. |
| 2006/0083403 | A1 | 4/2006 | Zhang et al. |
| 2006/0095401 | A1 | 5/2006 | Krikorian et al. |
| 2006/0107195 | A1 | 5/2006 | Ramaswamy et al. |
| 2006/0107302 | A1 | 5/2006 | Zdepski |
| 2006/0136564 | A1 | 6/2006 | Ambrose |
| 2006/0167747 | A1 | 7/2006 | Goodman et al. |
| 2006/0168613 | A1 | 7/2006 | Wood et al. |
| 2006/0212710 | A1 | 9/2006 | Baum et al. |
| 2006/0221173 | A1 | 10/2006 | Duncan |
| 2006/0224798 | A1 | 10/2006 | Kelin et al. |
| 2007/0006250 | A1 | 1/2007 | Croy et al. |
| 2007/0016918 | A1 | 1/2007 | Alcorn et al. |
| 2007/0055987 | A1 | 3/2007 | Lu et al. |
| 2007/0110089 | A1 | 5/2007 | Essafi et al. |
| 2007/0118375 | A1 | 5/2007 | Kenyon et al. |
| 2007/0124771 | A1 | 5/2007 | Shvadron |
| 2007/0127717 | A1 | 6/2007 | Herre et al. |
| 2007/0129952 | A1 | 6/2007 | Kenyon et al. |
| 2007/0143778 | A1 | 6/2007 | Covell et al. |
| 2007/0149114 | A1 | 6/2007 | Danilenko |
| 2007/0162927 | A1 | 7/2007 | Ramaswamy et al. |
| 2007/0198738 | A1 | 8/2007 | Angiolillo et al. |
| 2007/0201835 | A1 | 8/2007 | Rhoads |
| 2007/0226760 | A1 | 9/2007 | Neuhauser et al. |
| 2007/0274523 | A1 | 11/2007 | Rhoads |
| 2007/0276925 | A1 | 11/2007 | La Joie et al. |
| 2007/0276926 | A1 | 11/2007 | La Joie et al. |
| 2007/0288476 | A1 | 12/2007 | Flanagan, III et al. |
| 2007/0294057 | A1 | 12/2007 | Crystal et al. |
| 2007/0294132 | A1 | 12/2007 | Zhang et al. |
| 2007/0294705 | A1 | 12/2007 | Gopalakrishnan et al. |
| 2007/0294706 | A1 | 12/2007 | Neuhauser et al. |
| 2008/0019560 | A1 | 1/2008 | Rhoads |
| 2008/0022114 | A1 | 1/2008 | Moskowitz |
| 2008/0027734 | A1 | 1/2008 | Zhao et al. |
| 2008/0028223 | A1 | 1/2008 | Rhoads |
| 2008/0028474 | A1 | 1/2008 | Horne et al. |
| 2008/0040354 | A1 | 2/2008 | Ray et al. |
| 2008/0059160 | A1 | 3/2008 | Saunders et al. |
| 2008/0065507 | A1 | 3/2008 | Morrison et al. |
| 2008/0077956 | A1 | 3/2008 | Morrison et al. |
| 2008/0082510 | A1 | 4/2008 | Wang et al. |
| 2008/0082922 | A1 | 4/2008 | Biniak et al. |
| 2008/0083003 | A1 | 4/2008 | Biniak et al. |
| 2008/0133223 | A1 | 6/2008 | Son et al. |
| 2008/0137749 | A1 | 6/2008 | Tian et al. |
| 2008/0139182 | A1 | 6/2008 | Levy et al. |
| 2008/0140573 | A1 | 6/2008 | Levy et al. |
| 2008/0168503 | A1 | 7/2008 | Sparrell |
| 2008/0209491 | A1 | 8/2008 | Hasek |
| 2008/0215333 | A1 | 9/2008 | Tewfik et al. |
| 2008/0219496 | A1 | 9/2008 | Tewfik et al. |
| 2008/0235077 | A1 | 9/2008 | Harkness et al. |
| 2009/0031037 | A1 | 1/2009 | Mendell et al. |
| 2009/0031134 | A1 | 1/2009 | Levy |
| 2009/0070408 | A1 | 3/2009 | White |
| 2009/0070587 | A1 | 3/2009 | Srinivasan |
| 2009/0119723 | A1 | 5/2009 | Tinsman |
| 2009/0125310 | A1 | 5/2009 | Lee et al. |

(56) References Cited

U.S. PATENT DOCUMENTS

| | | | |
|---|---|---|---|
| 2009/0150553 A1 | 6/2009 | Collart et al. |
| 2009/0259325 A1 | 10/2009 | Topchy et al. |
| 2009/0265214 A1 | 10/2009 | Jobs et al. |
| 2009/0307061 A1 | 12/2009 | Monighetti et al. |
| 2009/0307084 A1 | 12/2009 | Monighetti et al. |
| 2010/0049474 A1 | 2/2010 | Kolessar et al. |
| 2010/0135638 A1 | 6/2010 | Mio |
| 2010/0138770 A1 | 6/2010 | Lu et al. |
| 2010/0166120 A1 | 7/2010 | Baum et al. |
| 2013/0096706 A1 | 4/2013 | Srinivasan et al. |

FOREIGN PATENT DOCUMENTS

| | | |
|---|---|---|
| AU | 2003230993 | 11/2003 |
| AU | 2006203639 | 9/2006 |
| BR | 0112901 | 6/2003 |
| BR | 0309598 | 2/2005 |
| CA | 1318967 | 6/1993 |
| CA | 2353303 | 1/2003 |
| CA | 2483104 | 11/2003 |
| CN | 1149366 | 5/1997 |
| CN | 1253692 | 5/2000 |
| CN | 1372682 | 10/2002 |
| CN | 1592906 | 3/2005 |
| CN | 1647160 | 7/2005 |
| CN | 101243688 | 8/2008 |
| CN | 101262292 | 9/2008 |
| EP | 0309269 | 3/1989 |
| EP | 0325219 | 7/1989 |
| EP | 0703683 | 3/1996 |
| EP | 0744695 | 11/1996 |
| EP | 0769749 | 4/1997 |
| EP | 0944991 | 9/1999 |
| EP | 1043853 | 10/2000 |
| EP | 1089201 | 4/2001 |
| EP | 1089564 | 4/2001 |
| EP | 1267572 | 12/2002 |
| EP | 1349370 | 10/2003 |
| EP | 1406403 | 4/2004 |
| EP | 1307833 | 6/2006 |
| EP | 1745464 | 10/2007 |
| EP | 1704695 | 2/2008 |
| EP | 1504445 | 8/2008 |
| GB | 2176639 | 12/1986 |
| JP | 5324352 | 12/1993 |
| JP | 5347648 | 12/1993 |
| JP | 6085966 | 3/1994 |
| JP | 7123392 | 5/1995 |
| JP | 2001040322 | 8/2002 |
| JP | 2002247610 | 8/2002 |
| JP | 2003208187 | 7/2003 |
| JP | 2003536113 | 12/2003 |
| JP | 2006154851 | 6/2006 |
| JP | 2007318745 | 12/2007 |
| JP | 4408453 | 11/2009 |
| WO | 8907868 | 8/1989 |
| WO | 95/12278 | 5/1995 |
| WO | 95/26106 | 9/1995 |
| WO | 9600950 | 1/1996 |
| WO | 9617467 | 6/1996 |
| WO | 96/27264 | 9/1996 |
| WO | 9628904 | 9/1996 |
| WO | 9632815 | 10/1996 |
| WO | 9637983 | 11/1996 |
| WO | 9641495 | 12/1996 |
| WO | 9702672 | 1/1997 |
| WO | 9715007 | 4/1997 |
| WO | 98/26529 | 6/1998 |
| WO | 9826571 | 6/1998 |
| WO | 9831155 | 7/1998 |
| WO | 9527349 | 10/1998 |
| WO | 99/59275 | 11/1999 |
| WO | 00/04662 | 1/2000 |
| WO | 0019699 | 4/2000 |
| WO | 00/72309 | 11/2000 |
| WO | 0119088 | 3/2001 |
| WO | 0124027 | 4/2001 |
| WO | 0131497 | 5/2001 |
| WO | 0140963 | 6/2001 |
| WO | 0153922 | 7/2001 |
| WO | 0175743 | 10/2001 |
| WO | 0191109 | 11/2001 |
| WO | 0205517 | 1/2002 |
| WO | 0211123 | 2/2002 |
| WO | 0215081 | 2/2002 |
| WO | 0217591 | 2/2002 |
| WO | 0219625 | 3/2002 |
| WO | 0227600 | 4/2002 |
| WO | 0237381 | 5/2002 |
| WO | 0245034 | 6/2002 |
| WO | 02061652 | 8/2002 |
| WO | 02065305 | 8/2002 |
| WO | 02065318 | 8/2002 |
| WO | 02069121 | 9/2002 |
| WO | 02098029 | 12/2002 |
| WO | 03009277 | 1/2003 |
| WO | 03091990 | 11/2003 |
| WO | 03094499 | 11/2003 |
| WO | 03096337 | 11/2003 |
| WO | 2004010352 | 1/2004 |
| WO | 2004040416 | 5/2004 |
| WO | 2004040475 | 5/2004 |
| WO | 2005025217 | 3/2005 |
| WO | 2005064885 | 7/2005 |
| WO | 2005101243 | 10/2005 |
| WO | 2005111998 | 11/2005 |
| WO | 2006012241 | 2/2006 |
| WO | 2006025797 | 3/2006 |
| WO | 2007056531 | 5/2007 |
| WO | 2007056532 | 5/2007 |
| WO | 2008042953 | 4/2008 |
| WO | 2008044664 | 4/2008 |
| WO | 2008045950 | 4/2008 |
| WO | 2008110002 | 9/2008 |
| WO | 2008110790 | 9/2008 |
| WO | 2009011206 | 1/2009 |
| WO | 2009061651 | 5/2009 |
| WO | 2009064561 | 5/2009 |

OTHER PUBLICATIONS

Wactlar et al., "Digital Video Archives: Managing Through Metadata" Building a National Strategy for Digital Preservation: Issues in Digital Media Archiving, Apr. 2002, pp. 84-88. [httr://www.informedia.cs.cmu.edu/documents/Wactlar-CUR-final.gdf, retrieved on Jul. 20, 2006] (14 pages).

Mulder, "The Integration of Metadata From Production to Consumer," EBU Technical Review, Sep. 2000, pp. 1-5. [http://www.ebu.ch/en/technical/trev/trcv_284-contcnts.html, retrieved on Jul. 20, 2006] (5 pages).

Hopper, "EBU Project Group P/META Metadata Exchange Standards," EBU Technical Review, Sep. 2000, pp. 1-24. [http://v,•ww.ebu.ch/en/technical/trev/trev_284-contents.html, retrieved on Jul. 20, 2006] (24 pages).

Evain, "TV-Anytime Metadata—A Preliminary Specification on Schedule!," EBU Technical Review, Sep. 2000, pp. 1-14. [http://www.ebu.ch/en/technical/trev/trev_284-contents.html, retrieved on Jul. 20, 2006] (14 pages).

"EBU Technical Review (Editorial)," No. 284 Sep. 2000, pp. 1-3. [http://www.ebu.ch/en/technical/trev/trev_284-contcnts.html, retrieved on Jul. 20, 2006] (3 pages).

Apr. 22, 2009 Complaint in *Arbitron Inc.*, v. *John Barrett Kiefl* in United States District Court for the Southern District of New York. Case 1 :09-cv-04013-PAC.

Apr. 8, 2009 Letter from John S. Macera (representing Kiefl) to Michael Skarzynski (of Arbitron) re: alleged patent infringement. (Exhibit I of the Apr. 22, 2009 Complaint in *Arbitron Inc.*, v. *John Barrett Kiefl* in United States District Court for the Southern District of New York. Case 1:09-cv-04013-PAC.).

(56) References Cited

OTHER PUBLICATIONS

Apr. 24, 2009 Letter from Michael Skarzynski (of Arbitron) to John S. Macera (representing Kiefl) re: alleged patent infringement.
United States Patent and Trademark Office, "Notice of Allowance," issued in connection with U.S. Appl. No. 10/205,808, on Feb. 26, 2007 (7 pages).
United States Patent and Trademark Office, "Notice of Allowance," issued in connection with U.S. Appl. No. 10/205,808, on Sep. 26, 2006 (11 pages).
United States Patent and Trademark Office, "Non-Final Office Action," issued in connection with U.S. Appl. No. 10/205,808, on Mar. 28, 2005 (19 pages).
United States Patent and Trademark Office, "Non-Final Office Action," issued in connection with U.S. Appl. No. 10/205,808, on Dec. 10, 2004 (17 pages).
United States Patent and Trademark Office, "Non-Final Office Action," issued in connection with U.S. Appl. No. 10/205,808, on Dec. 20, 2005 (20 pages).
United States Patent and Trademark Office, "Notice of Allowance," issued in connection with U.S. Appl. No. 11/767,254, on Mar. 12, 2009 (8 pages).
United States Patent and Trademark Office, "Notice of Allowance," issued in connection with U.S. Appl. No. 11/767,254, on Jul. 30, 2009 (8 pages).
United States Patent and Trademark Office, "Non-Final Office Action," issued in connection with U.S. Appl. No. 11/767,254, on Oct. 1, 2008 (16 pages).
Patent Cooperation Treaty, "International Preliminary Examination Report," issued in connection with PCT Patent Application Serial No. PCT/US03/22370, on May 6, 2005 (3 pages).
Patent Cooperation Treaty, "International Search Report," issued in connection with PCT Patent Application Serial No. PCT/US03/22370, on Mar. 11, 2004 (1 page).
Tally Systems Corp, "Tally Systems Patents Software Inventorying Technology," retrieved from www.tallysys.com, on Jul. 1, 1996 (5 pages).
"Lan Times 1995 Index: Application Administration & Management," LAN Times (1995) (5 pages).
R. Lisle, "'The Management Features in Software-Metering Tools Can Save You a Bundle," LAN Times, Jul. 3, 1995 (3 pages).
T. Johnson, "Research in the Future: The Role and Measurement of the Internet," ARF 60w Anniversary Annual Conference and Research Expo, Mar. 11-13, 1996 (4 pages).
"The Top Five Advertising Agencies Now Subscribe to PC-Meter Web Measurement Services," at http://www.npd.com:80/pcmprl0.htm on Jul. 1, 1996 (2 pages).
"Demographics," at http://www.w3.org/pub/WWW/Demographics on Oct. 4, 1996 (3 pages).
D. Hoffman et al., "How Big is the Internet," Aug. 18, 1994 (2 pages).
M. Brownstein, "Streamlined and Ready for Action," NETGUIDE (1996), pp. 81, 83-86, 88, 90, 95-96.
B. Harvey, "Interactive Standards," The Marketing Pulse, vol. XN, Issue 12, Aug. 31, 1994, pp. 1-6.
Chiat/Day, "The New Video Highway: What Will We Need to Know? How Will We Measure It?" Advertising Research Foundation, Jun. 29, 1994, pp. 1-12.
M. Green et al., "The Evolution of Research Problems on the Information Superhighway," JMCT Media Research, Jun. 1994 (7 pages).
"Preliminary Summary Overview of Studies ofInteractivity for 4AS Casie Research Sub-Committee," Next Century Media, Inc., pp. 1-11, Oct. 4, 1996.
Release Notes for NeTraMet as found on The Worldwide Web on Jul. 1, 1996 (2 pages).
Infoseek Internet Search Results When Searching for "NPD" on Jul. 1, 1996 (2 pages).
Print of page from The Worldwide Web, http://www.npd.com/pcmdef.htm on Jul. 1, 1996 (1 page).
Print of page from The Worldwide Web, http://www.npd.com:80/pcmeter.htm on Jul. 1, 1996 (1 page).
Print of page from The Worldwide Web, http://www.npd.com:80/pcmpr.htm on Jul. 1, 1996 (1 page).
E. English, "The Meter's Running," LAN Times, Mar. 27, 1995 (2 pages).
Marketing News, Jun. 3, 1996, Section: 1996 Business Report on the Marketing Research Industry (36 pages).
"Latest NPD Survey Finds World Wide Web Access from Homes Grew Fourfold in Second Half of 1995," from http://www.npd.com:80/meterpr4.htm on Jul. 1, 1996 (1 page).
"First Demographic Data on Home World Wide Web Use Now Available from the NPD Group," from http://www.npd.com:80/meterpr6.htm on Jul. 1, 1996 (2 pages).
"America Online is Leading Destination of Web Surfers in First-ever PC-Meter Sweeps Citing Top 25 Web Sites," from http://www.npd.com:80/meterpr5.htm on Jul. 1, 1996 (3 pages).
"NPD's PC-Meter Service to Provide More Accurate Measure of World Wide Web Traffic," from http://www.npd.com:80/meterpr.htm on Jul. 1, 1996 (1 page).
"PC-Meter Now in 1,000 Households Nationwide," from http://www.npd.com:80/meterpr2.htm on Jul. 1, 1996 (1 page).
"PC-Meter Predicts Happy Holidays for Computer Manufacturers and Retailers," http://www.npd.com:80/meterpr3.htm on Jul. 1, 1996 (1 page).
Electronic News, vol. 42, No. 2110, Monday, Apr. 1, 1996 (4 pages).
Interactive Marketing News, Friday, Jul. 5, 1996 (1 page).
Advertising Age, Special Report, Monday, May 30, 1996 (1 page).
Charlottesville Business Journal, vol. 7, No. 2, Thursday, Feb. 1, 1996 (6 pages).
P. Helsinki, "Automating Web-Site Maintenance Part 2 Peri-Based Tools to Manage Your Website," Web Techniques, vol. 1, No. 9, XP-002048313, Dec. 1996, pp. 75-78.
M. Lafferty, "Taking the PC Out of the Data Comm Loop: New Techniques Bring Mass Market and Net Together on TV," CED: Communications Engineering and Design, vol. 22, No. 9, XP-002079179, Aug. 1996, pp. 34-38.
Fink et al., "Social- and Interactive- Television Applications Based on Real-Time Ambient-Audio Identification," EuroiTV, 2006 (10 pages).
Claburn, "Google Researchers Propose TV Monitoring," Information Week, Jun. 7, 2006 (3 pages).
Anderson, "Google to compete with Nielsen for TV-ratings info?," Ars Technica, Jun. 19, 2006 (2 pages).
"What is Jacked?," httn://www.jacked.com, retrieved on Dec. 3, 2009 (1 page).
Sullivan, "Google Cozies Up to SMBs for Digital Content," MediaPost News, Mar. 18, 2009, (2 pages).
Wang, "An Industrial-Strength Audio Search Algorithm," Shazam Entertainment, Ltd., in Proceedings of the Fourth International Conference on Music Information Retrieval, Baltimore, Oct. 26-30, 2003 (7 pages).
Boehret, "Yahoo Widgets Lend Brains to Boob Tube," The Wall Street Journal, Mar. 25, 2009 (3 pages).
Stross, "Apple Wouldn't Risk Its Cool Over a Gimmick, Would It?," The New York Times, Nov. 14, 2009 (3 pages).
Stultz, "Handheld Captioning at Disney World Theme Parks," article retrieved on Mar. 19, 2009, http://goflorida.about.com/od/disneyworld/a/wdw_captioning.htm, (2 pages).
Kane, "Entrepreneur Plans On-Demand Videogame Service," The Wall Street Journal, Mar. 24, 2009 (2 pages).
Shazam, "Shazam turns up the volume on mobile music," http://www.shazam.com/music/web/newsdetail.html?nid=NEWS137, Nov. 28, 2007 (1 page).
Shazam, "Shazam and VidZone Digital Media announce UK1s first fixed price mobile download service for music videos," http://www.shazam.com/music/web/newsdetail.html?nid=NEWS136, Feb. 11, 2008 ( 1 page).
Shazam, "Shazam launches new music application for Facebook fans," http://www.shazam.com/music/web/newsdetail.html?nid=NEWS135, Feb. 18, 2008 ( 1 page) p. 6.

* cited by examiner

SYSTEMS AND METHODS FOR GATHERING AUDIENCE MEASUREMENT DATA

CROSS-REFERENCE TO RELATED APPLICATION

This application is a continuation of prior U.S. non-provisional patent application Ser. No. 11/767,254, filed Jun. 22, 2007, now U.S. Pat. No. 7,640,141, which is a continuation of prior U.S. non-provisional patent application Ser. No. 10/205,808, filed Jul. 26, 2002, now U.S. Pat. No. 7,239,981, assigned to the assignee of the present invention and hereby incorporated herein by reference in its entirety.

TECHNICAL FIELD

The present invention relates to techniques for gathering audience measurement data by detecting such data encoded in audio data.

BACKGROUND INFORMATION

There is considerable interest in measuring the usage of media accessed by an audience to provide market information to advertisers, media distributors and the like.

In the past there were relatively few alternatives for distributing media, such as analog radio and television, analog recordings, newspapers and magazines and relatively few media producers and distributors. Moreover, the marketplace for media distributed via one technology was distinct from the marketplace for media distributed in a different manner. The radio and television industries, for example, had their distinctly different media content and delivery methodologies. Recorded media was distributed and reproduced in distinctly different ways, although the content was often adapted for radio or television distribution.

Audience measurement has evolved in a similar manner tracking the market segmentation of the media distribution industry. Generally, audience measurement data has been gathered, processed and reported separately for each media distribution market segment The development of techniques to efficiently process, store and communicate digital data has enabled numerous producers and distributors of media to enter the marketplace. Users of media now have a great many choices which did not exist only a few years ago. Established producers and distributors have responded with their own efforts to provide media in digital form to users. This trend is enhanced with each improvement in digital processing, storage and communications.

A result of these developments is a convergence of media distribution within the digital realm, especially through distribution via the Internet. Media is thus available to users not only through traditional distribution channels, but also via alternative digital communication pathways. For example, many radio stations now provide their programming via the Internet as well as over the air.

The emergence of multiple, overlapping media distribution pathways, as well as the wide variety of available user systems (e.g. PC's, PDA's, portable CD players, Internet, appliances, TV, radio, etc.) for accessing media, has greatly complicated the task of measuring media audiences. The development of commercially-viable techniques for encoding audio data with audience measurement data provides a crucial tool for measuring media usage across multiple media distribution pathways and user systems. Most notable among these techniques is the CBET methodology developed by Arbitron Inc., which is already providing useful audience estimates to numerous media distributors and advertisers.

However, the bandwidth for data encoded in audio is limited by the needs to maintaining inaudibility of the codes while ensuring that they are reliably detectable. Nevertheless, today more data is required for audience measurement than ever before. Not only is it necessary to detect the source of the data, but also to detect how it was distributed (e.g., over-the-air vs. Internet) and how it was reproduced (e.g. by a conventional radio, PC, etc., as well as the player software employed).

Accordingly, it is desired to provide data gathering techniques for audience measurement data capable of measuring media usage across multiple distribution paths and user systems.

It is also desired to provide such data gathering techniques which are likely to be adaptable to future media distribution paths and user systems which are presently unknown.

SUMMARY OF THE INVENTION

For this application, the following terms and definitions shall apply, both for the singular and plural forms of nouns and for all verb tenses:

The term "data" as used herein means any indicia, signals, marks, domains, symbols, symbol sets, representations, and any other physical form or forms representing information, whether permanent or temporary, whether visible, audible, acoustic, electric, magnetic, electromagnetic, or otherwise manifested. The term "data" as used to represent predetermined information in one physical form shall be deemed to encompass any and all representations of the same predetermined information in a different physical form or forms.

The term "audio data" as used herein means any data representing acoustic energy, including, but not limited to, audible sounds, regardless of the presence of any other data, or lack thereof, which accompanies, is appended to, is superimposed on, or is otherwise transmitted or able to be transmitted with the audio data.

The term "user system" as used herein means any software, devices, or combinations thereof which are useful for reproducing audio data as sound for an audience member, including, but not limited to, computers, televisions, radios, personal digital assistants, and internet appliances.

The term "network" as used herein means networks of all kinds, including both intra-networks and inter-networks, including, but not limited to, the Internet, and is not limited to any particular such network.

The term "source identification data" as used herein means any data that is indicative of a source of audio data, including, but not limited to, (a) persons or entities that create, produce, distribute, reproduce, communicate, have a possessory interest in, or are otherwise associated with the audio data, or (b) locations, whether physical or virtual, from which data is communicated, either originally or as an intermediary, and whether the audio data is created therein or prior thereto.

The terms "audience" and "audience member" as used herein mean a person or persons, as the case may be, who access audio data in any manner, whether alone or in one or more groups, whether in the same or various places, and whether at the same time or at various different times.

The term "audience measurement data" as used herein means data wheresoever originating which comprises source identification data or which otherwise characterizes or provides information about audio data, or else concerns (a) a user system that requests, communicates, receives, or presents audio data, (b) a network that requests, receives, or presents audio data for a user, user system, or another network, or (c) an audience or audience member, including, but not limited to, user demographic data.

The term "processor" as used herein means data processing devices, apparatus, programs, circuits, systems, and subsystems, whether implemented in hardware, software, or both.

The terms "communicate" and "communicating" as used herein include both conveying data from a source to a destination, as well as delivering data to a communications medium, system or link to be conveyed to a destination. The term "communication" as used herein means the act of communicating or the data communicated, as appropriate.

The terms "coupled", "coupled to", and "coupled with" shall each mean a relationship between or among two or more devices, apparatus, files, programs, media, components, networks, systems, subsystems, and/or means, constituting any one or more of (a) a connection, whether direct or through one or more other devices, apparatus, files, programs, media, components, networks, systems, subsystems, or means, (b) a communications relationship, whether direct or through one or more other devices, apparatus, files, programs, media, components, networks, systems, subsystems, or means, or (c) a functional relationship in which the operation of any one or more of the relevant devices, apparatus, files, programs, media, components, networks, systems, subsystems, or means depends, in whole or in part, on the operation of any one or more others thereof.

In accordance with an aspect of the present invention, a method is provided for gathering audience measurement data relating to the exposure of an audience member to audio data. The method comprises receiving the audio data in a user system adapted to reproduce the audio data as sound; encoding the audio data in the user system with audience measurement data to produce encoded audio data; reproducing the encoded audio data as encoded sound by means of the user system; receiving the encoded sound in a monitor device to produce received audio data; and decoding the audience measurement data from the received audio data.

In accordance with another aspect of the present invention, a system is provided for gathering audience measurement data relating to exposure of an audience member to audio data reproduced by a user system. The system comprises an encoder coupled with the user system to encode audio data which has been received in the user system with audience measurement data to produce encoded audio data; and a decoder device having an input to receive the encoded audio data for decoding the audience measurement data encoded therein.

In accordance with a further aspect of the present invention, a method is provided for gathering data relating to exposure of an audience member to streaming media reproduced by a user system. The method comprises receiving streaming media including audio data in a user system; encoding the audio data received in the user system with audience measurement data; reproducing the encoded audio data as encoded acoustic energy; receiving the encoded acoustic energy in a portable monitor carried on the person of an audience member; and decoding the audience measurement data in the encoded acoustic energy received in the portable monitor.

In accordance with still another aspect of the present invention, a system is provided for gathering audience measurement data relating to exposure of an audience member to streaming media in the form of audio data reproduced by a user system. The system comprises an encoder coupled with the user system to encode audio data which has been received in the user system as streaming media with audience measurement data and to supply the encoded audio data to be reproduced by the user system; a portable monitor adapted to be carried on the person of an audience member to transduce the encoded audio data reproduced by the user system; and a decoder coupled with the portable monitor to receive the transduced encoded audio data and to decode the audience measurement data in the transduced encoded audio data.

In accordance with yet another aspect of the present invention, a method is provided for gathering data relating to exposure of an audience member to streaming media. The method comprises receiving streaming media in a user system, the streaming media including audio data and source identification data for the audio data and separate therefrom; encoding the audio data in the user system with the source identification data to form encoded audio data; reproducing the encoded audio data as encoded acoustic energy; receiving the encoded acoustic energy in a portable monitor carried on the person of an audience member; and decoding the source identification data encoded in the encoded acoustic energy received by the portable monitor.

In accordance with still another aspect of the present invention, a method is provided for gathering audience measurement data. The method comprises encoding audio data in a user system with first audience measurement data, the user system being arranged to reproduce the audio data as sound; and decoding the first audience measurement data in the encoded audio data.

The invention and its particular features and advantages will become more apparent from the following detailed description considered with reference to the accompanying drawings.

DETAILED DESCRIPTION OF CERTAIN ADVANTAGEOUS EMBODIMENTS

Figure 1:
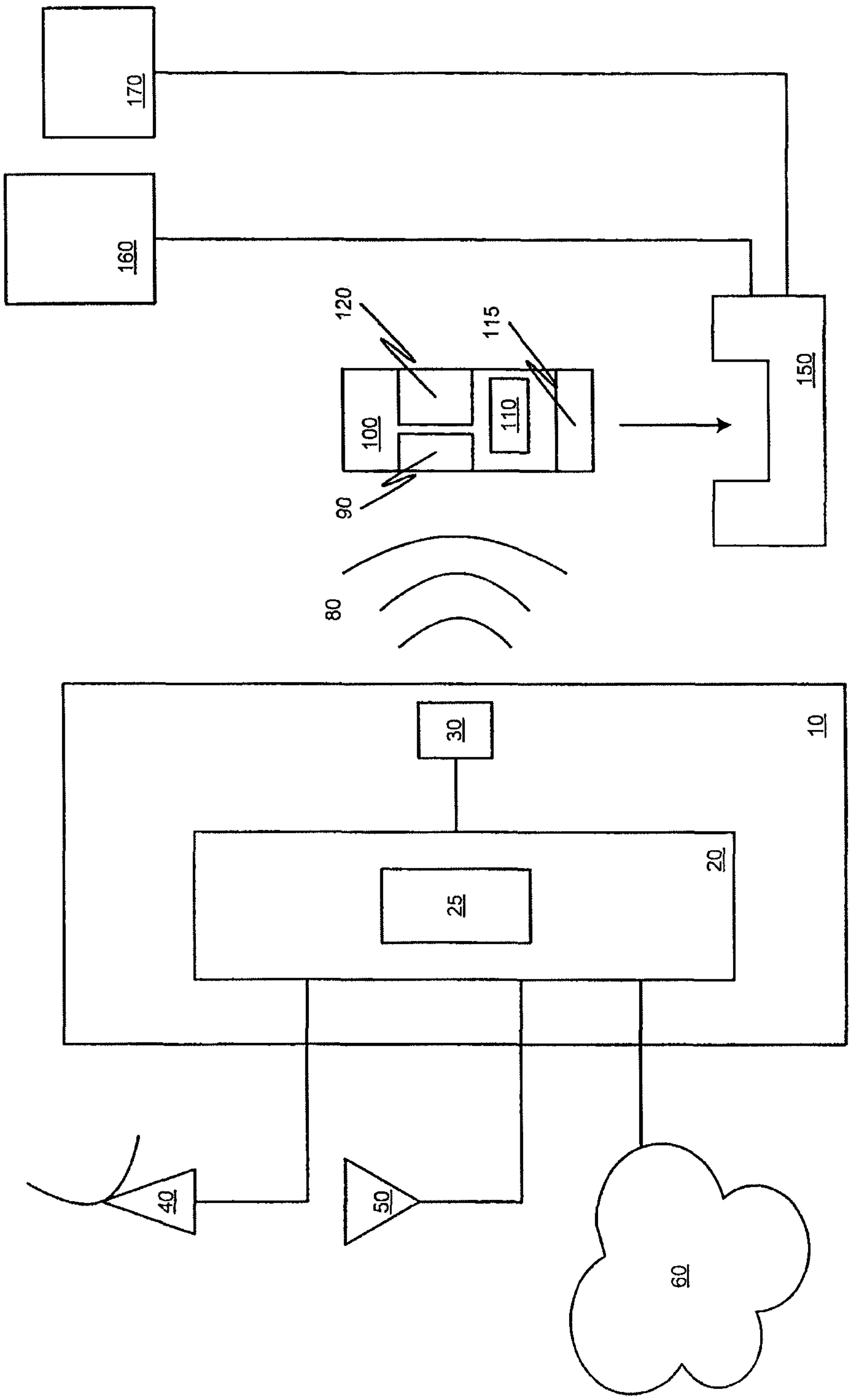
FIG. 1 is a functional block diagram for use in illustrating various embodiments of systems and methods for gathering audience measurement data relating to exposure of an audience member to audio data.

FIG. 1 illustrates an embodiment of a system 10 for encoding and reproducing audio data by means of a user system 20, an encoder 25, and an acoustic reproducing device 30. The source of the audio data may be a satellite receiver 40, an antenna 50 and/or a network 60 such as a cable television system or the Internet. The source of the audio data may also be any one or more of a web site, a broadcast channel, a content channel, an online channel, a radio station, a television station, a media organization, and/or a storage medium. The user system 20 is coupled with the audio data source in any available manner including but not limited to over-the-air (wireless), cable, satellite, telephone, DSL (Direct Subscriber Line), LAN (Local Area Network), WAN (Wide Area Network), Intranet, and/or the Internet. The invention is particularly useful for monitoring exposure to streaming media delivered via the Internet The user system 10 includes one or more coupled devices that serve, among other things, to supply the audio data to the acoustic reproducing device 30 for reproduction as acoustic energy 80. In certain embodiments, the user system 20 is a computer, a radio, a television, a cable converter, a satellite television system, a game playing system, a VCR, a DVD player, a portable audio player, an internet appliance, a PDA (personal digital assistant), a cell phone, a home theater system, a component stereo system, and/or an electronic book. In one embodiment, the acoustic reproducing device 30 is a speaker. In another embodiment, the acoustic reproducing device 30 is a speaker system. In other embodiments, the acoustic reproducing device 30 is any device capable of producing acoustic energy 80.

In certain embodiments, the encoder 25 present in the user system 20 embeds audience measurement data in the audio data. In certain embodiments, the encoder comprises software running on the user system 20, including embodiments in which the encoding software is integrated or coupled with a player running on the user system 20. In other embodiments, the encoder 25 comprises a device coupled with the user system 20 such as a peripheral device, or a board, such as a soundboard. In certain embodiments, the board is plugged into an expansion slot of the user system. In certain embodiments, the encoder 25 is programmable such that it is provided with encoding software prior to coupling with the user system or after coupling with the user system. In these embodiments, the encoding software is loaded from a storage device or from the audio source or another source, or via another communication system or medium.

In certain embodiments, the encoder 25 encodes the audience measurement data as a further encoded layer in already-encoded audio data, so that two or more layers of embedded data are simultaneously present in the audio data. The layers are arranged with sufficiently diverse frequency characteristics so that they may be separately detected. In certain of these embodiments the code is superimposed on the audio data asynchronously. In other embodiments, the code is added synchronously with the preexisting audio data. In certain ones of such synchronous encoding embodiments data is encoded in portions of the audio data which have not previously been encoded. At times the user system receives both audio data (such as streaming media) and audience measurement data (such as source identification data) which, as received, is not encoded in the audio data but is separate therefrom. In certain embodiments, the user system 220 supplies such audience measurement data to the encoder 200 which serves to encode the audio data therewith.

In certain embodiments the audience measurement data is source identification data, content identification code, data that provides information about the received audio data, demographic data regarding the user, and/or data describing the user system or some aspect thereof, such as the user agent (e.g. player or browser type), operating system, sound card, etc. In one embodiment, the audience measurement data is an identification code. In certain embodiments for measuring exposure of any audience member to audio data obtained from the Internet, such as streaming media, the audience measurement data comprises data indicating that the audio data was obtained from the Internet, the type of player and/or source identification data.

Several advantageous and suitable techniques for encoding audience measurement data in audio data are disclosed in U.S. Pat. No. 5,764,763 to James M. Jensen, et al., which is assigned to the assignee of the present application, and which is incorporated by reference herein. Other appropriate encoding techniques are disclosed in U.S. Pat. No. 5,579,124 to Aijala, et al., U.S. Pat. Nos. 5,574,962, 5,581,800 and 5,787,334 to Fardeau, et al., U.S. Pat. No. 5,450,490 to Jensen, et al., and U.S. patent application Ser. No. 09/318,045, in the names of Neuhauser, et al., each of which is assigned to the assignee of the present application and all of which are incorporated herein by reference.

Still other suitable encoding techniques are the subject of PCT Publication WO 00/04662 to Srinivasan, U.S. Pat. No. 5,319,735 to Preuss, et al., U.S. Pat. No. 6,175,627 to Petrovich, et al., U.S. Pat. No. 5,828,325 to Wolosewicz, et al., U.S. Pat. No. 6,154,484 to Lee, et al., U.S. Pat. No. 5,945,932 to Smith, et al., PCT Publication WO 99/59275 to Lu, et al., PCT Publication WO 98/26529 to Lu, et al., and PCT Publication WO 96/27264 to Lu, et al, all of which are incorporated herein by reference.

In certain embodiments, the encoder 25 forms a data set of frequency-domain data from the audio data and the encoder processes the frequency-domain data in the data set to embed the encoded data therein. Where the codes have been formed as in the Jensen, et al. U.S. Pat. No. 5,764,763 or U.S. Pat. No. 5,450,490, the frequency-domain data is processed by the encoder 25 to embed the encoded data in the form of frequency components with predetermined frequencies. Where the codes have been formed as in the Srinivasan PCT Publication WO 00/04662, in certain embodiments the encoder processes the frequency-domain data to embed code components distributed according to a frequency-hopping pattern. In certain embodiments, the code components comprise pairs of frequency components modified in amplitude to encode information. In certain other embodiments, the code components comprise pairs of frequency components modified in phase to encode information. Where the codes have been formed as spread spectrum codes, as in the Aijala, et al. U.S. Pat. No. 5,579,124 or the Preuss, et al. U.S. Pat. No. 5,319,735, the encoder comprises an appropriate spread spectrum encoder.

The acoustic energy 80 produced by the acoustic reproducing device 30 is detected by a transducer 90 coupled to a portable monitor 100. The transducer 90 translates the acoustic energy 80 into detected audio data. In certain embodiments, the portable monitor 100 has an internal decoder 110 which serves to decode the encoded audience measurement data present in the detected audio data. The decoded audience measurement data is either stored in an internal storage device 120 to be communicated at a later time or else communicated from the monitor 100 once decoded. In other embodiments, the portable monitor 100 provides the detected audio data or a compressed version thereof to a storage device 120 for decoding elsewhere. The storage device 120 may be internal to the portable monitor 100 as depicted in FIG. 1, or the storage device may be external to the portable monitor 100 and coupled therewith to receive the data to be recorded. In still further embodiments, the portable monitor 100 receives and communicates audio data or a compressed version thereof to another device for subsequent decoding. In certain embodiments, the audio data is compressed by forming signal-to-noise ratios representing possible code components, such as in U.S. Pat. No. 5,450,490 or U.S. Pat. No. 5,764,763 both of which are assigned to the assignee of the present invention and are incorporated herein by reference.

The audience measurement data to be decoded in certain embodiments includes data already encoded in the audio data when received by the user system, data encoded in the audio data by the user system, or both.

There are several possible embodiments of decoding techniques that can be implemented for use in the present invention. Several advantageous techniques for detecting encoded audience measurement data are disclosed in U.S. Pat. No. 5,764,763 to James M. Jensen, et al., which is assigned to the assignee of the present application, and which is incorporated by reference herein. Other appropriate decoding techniques are disclosed in U.S. Pat. No. 5,579,124 to Aijala, et al., U.S. Pat. Nos. 5,574,962, 5,581,800 and 5,787,334 to Fardeau, et al., U.S. Pat. No. 5,450,490 to Jensen, et al., and U.S. patent application Ser. No. 09/318,045, in the names of Neuhauser, et al., each of which is assigned to the assignee of the present application and all of which are incorporated herein by reference.

Still other suitable decoding techniques are the subject of PCT Publication WO 00/04662 to Srinivasan, U.S. Pat. No. 5,319,735 to Preuss, et al., U.S. Pat. No. 6,175,627 to Petrovich, et al., U.S. Pat. No. 5,828,325 to Wolosewicz, et al., U.S. Pat. No. 6,154,484 to Lee, et al., U.S. Pat. No. 5,945,932 to Smith, et al., PCT Publication WO 99/59275 to Lu, et al., PCT Publication WO 98/26529 to Lu, et al., and PCT Publication WO 96/27264 to Lu, et al., all of which are incorporated herein by reference.

In certain embodiments, decoding is carried out by forming a data set from the audio data collected by the portable monitor 100 and processing the data set to extract the audience measurement data encoded therein. Where the encoded data has been formed as in U.S. Pat. No. 5,764,763 or U.S. Pat. No. 5,450,490, the data set is processed to transform the audio data to the frequency domain. The frequency domain data is processed to extract code components with predetermined frequencies. Where the encoded data has been formed as in the Srinivasan PCT Publication WO 00/04662, in certain embodiments the remote processor 160 processes the frequency domain data to detect code components distributed according to a frequency-hopping pattern. In certain embodiments, the code components comprise pairs of frequency components modified in amplitude to encode information which are processed to detect such amplitude modifications. In certain other embodiments, the code components comprise pairs of frequency components modified in phase to encode information and are processed to detect such phase modifications. Where the codes have been formed as spread spectrum codes, as in the Aijala, et al. U.S. Pat. No. 5,579,124 or the Preuss, et al. U.S. Pat. No. 5,319,735, an appropriate spread spectrum decoder is employed to decode the audience measurement data.

In the embodiment illustrated in FIG. 1, the portable monitor 100 is coupled with a base station 150 from time to time to download the detected audio data or decoded audience measurement data from the portable monitor 100. The base station 150 communicates this data to a remote processor 160 or a remote storage system 170 for producing audience measurement reports. The detected audio data or decoded audience measurement data is downloaded to the base station in either compressed or uncompressed form, depending on the embodiment. In one embodiment, the data is communicated from the base station 150 via the PSTN (public switched telephone network), accessed through a phone jack or via a cellular telephone. In another embodiment, the data is communicated via another network, such as the Internet. In yet another embodiment, the data is communicated via a satellite system or other wireless communications link.

In certain embodiments, the data is communicated from the base station 150 to a hub (not shown for purposes of simplicity and clarity) that collects such data from multiple base stations within a household, or directly from one or more portable monitors or both from one or more base stations and one or more portable monitors. The hub then communicates the collected data to the remote processor 160 or the remote storage system 170.

In certain embodiments, the base station 150 can also recharge an internal battery 115 on the portable monitor 100.

In certain embodiments, the portable monitor 100 and base station 150 are implemented as in U.S. Pat. No. 5,483,276 assigned to the assignee of the present invention and incorporated herein by reference.

In an alternative embodiment, a stationary monitor receives the acoustic energy from the acoustic reproducing device 30 and provides the functionality provided by the portable monitor in other embodiments described herein above. In certain ones of such embodiments, the stationary monitor is integrated with the base station in order to communicate the data in accordance with the embodiments disclosed above. In another embodiment, the stationary monitor receives the acoustic energy from the acoustic reproducing device and provides the functionality provided by both the portable monitor and the base station in other embodiments described herein; thus, here there is no separate base station as all functions of the base station are performed by the stationary monitor.

In certain embodiments, encoded audio from the user system is output as an electrical signal through a device, such as an output jack, for reproduction by headphones or by a system such as a stereo, surround sound, or home theater system. In some such embodiments, the encoded audio is supplied in electrical form for monitoring and to gather audience measurement data by means of a portable monitor, and in others by means of a stationary monitor.

Figure 2:
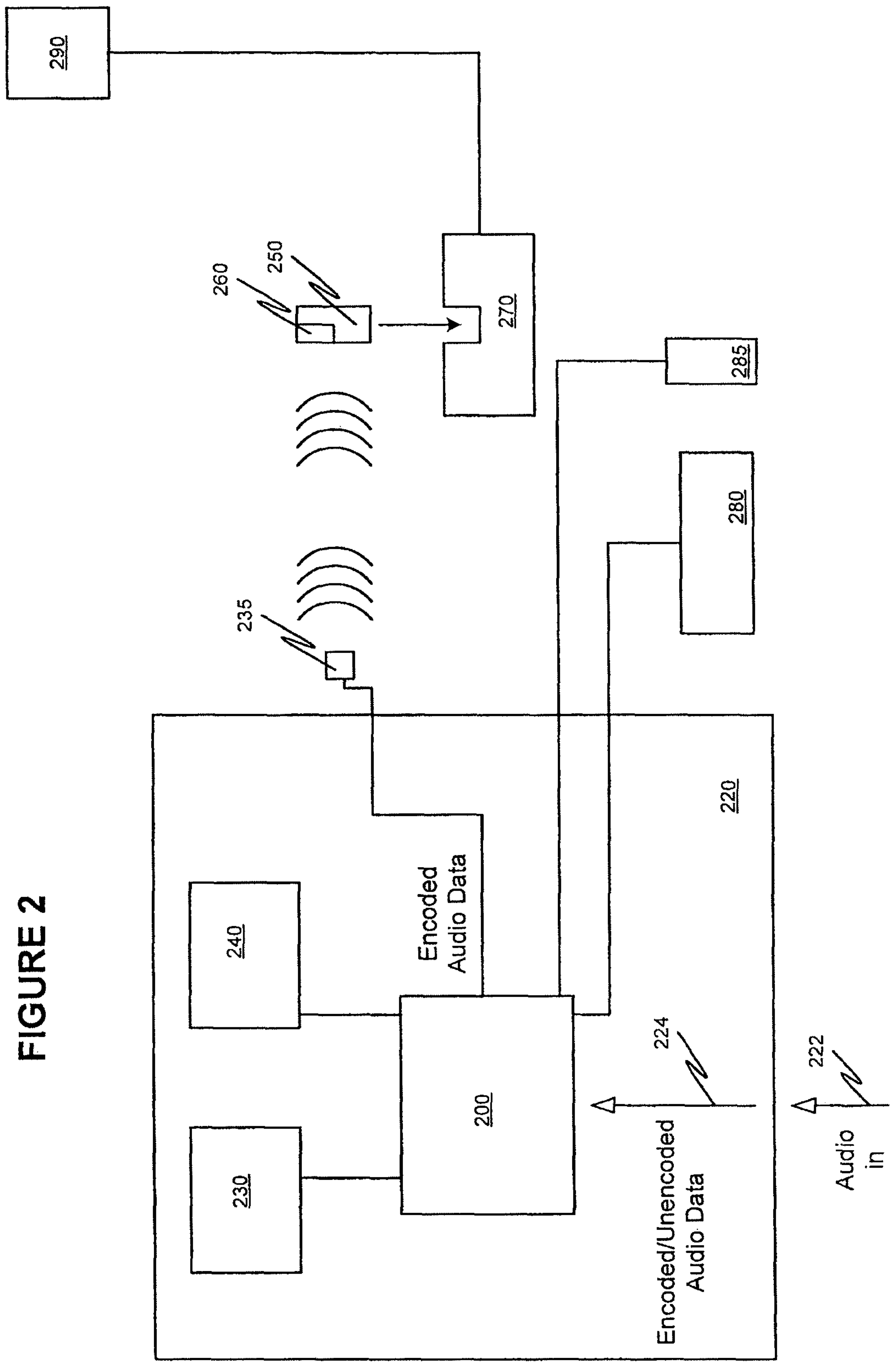
FIG. 2 is a functional block diagram for use in illustrating various additional embodiments of systems and methods for gathering audience measurement data relating to exposure of an audience member to audio data.

FIG. 2 illustrates various embodiments of a system 180 for encoding and reproducing audio data including a user system 220, an encoder 200 and an acoustic reproducing device 235. The user system 220 receives audio data, with or without associated data in other forms (such as video data, graphical data and/or textual data) as indicated at 222. The data may be supplied from any source, such as one or more of the audio data sources identified above in connection with FIG. 1. Moreover, as indicated at 224, the audio data at times will be encoded with audience measurement data, while at other times it may not be so encoded. As in the case of the embodiments described in connection with FIG. 1, encoder 200 is coupled with user system 220 to encode audience measurement data in the audio data 224 received in user system 220, and may be implemented by software running on user system 220 or as a device coupled with the user system 220 such as a peripheral device, or a board, such as a soundboard.

In certain embodiments, this audience measurement data is demographic data about the user. In other embodiments, this data is information about the user system or some portion thereof. In still other embodiments, this data is information about the audio data, such as its content or source. In still other embodiments, the data is qualitative data about the audience member or members. Further embodiments encode all or some of the above mentioned types of data in the audio data.

In one embodiment the user system 220 includes a player 230, and a browser 240 running on the user system 220. In certain embodiments, the player is capable of processing audio and/or video data for presentation. In other embodiments, the browser is capable of processing various types of received data for presentation, sending and receiving data, encrypting and decrypting data, linking to other information sources, transmitting audio data, launching player applications and file viewers, and navigating a file system.

In certain embodiments, the user system 220 gathers demographic data about a user or a set of users and encoder 200 encodes this data into the audio data. The demographic data may include data on some or all of the user's age, sex, race, interests, occupation, profession, income, etc. In certain embodiments, the demographic data gathered from a particular user is associated with a user ID that is also encoded into the audio data. The demographic data may be gathered from direct user input, user agents, software tracking history and user system usage, an examination of files on the user system or user profile data on the user system or elsewhere. In some embodiments, the user agent automates an action, such as demographic data gathering. In other embodiments, the user inputs demographic data via a keyboard 280, a pointing device 285, and/or other kinds of user input devices (e.g. touch screens, microphones, key pads, voice recognition software, etc.).

In certain embodiments, the encoder 200 encodes system data about the content being presented from the player or the browser, information about the player type, information about the browser type, information about the operating system type, information about the user, and/or information about a URL, a channel, or a source associated with the source of the audio data. The system data may be gathered from operating system messages, metalevel program interactions, network level messages, direct user input, user agents, software tracking history and user system usage, and examination of files on the user system or user profile data on the user system or elsewhere. In some embodiments, the user agent automates an action, such as system data gathering. In other embodiments, the user inputs system data via keyboard 280, pointing device 285, and/or other kinds of user input devices (e.g. touch screens, microphones, key pads, voice recognition software, etc.) In still further embodiments, software embedded in the encoder gathers system data.

FIG. 2 further illustrates a portable monitor 250 to be carried on the person of an audience member and including an acoustic transducer 260. Portable monitor 260 is coupled with a docking station 270 to download data as well as recharge batteries within monitor 260. Docking station 270 communicates with a remote processor or storage system 290 to provide data thereto for producing audience measurement reports. The monitor 250, transducer 260, docking station 270 and remote processor 290 may take any of the forms described above for comparable devices and substitutes in connection with FIG. 1.

Although the invention has been described with reference to particular arrangements and embodiments of services, systems, processors, devices, features and the like, these are not intended to exhaust all possible arrangements or embodiments, and indeed many other modifications and variations will be ascertainable to those of skill in the art.

What is claimed is:

1. A method for adding information to audio, the method comprising:

accessing an audio signal segment in a processing device capable of reproducing the audio as sound, the audio signal segment including first audience measurement data embedded into the audio signal segment;

embedding second audience measurement data in the audio signal segment in the processing device, the second audience measurement data being different from the first audience measurement data, and the first audience measurement data and second audience measurement data exist simultaneously existing in the audio signal segment simultaneously; and transmitting the audio signal segment for reproduction.

2. The method according to claim 1, wherein the audio signal segment includes streaming media.

3. The method of claim 1, wherein the first audience measurement data and the second audience measurement data include portions having frequency characteristics enabling separate detection of the first audience measurement data and the second audience measurement data.

4. The method of claim 1, wherein the second audience measurement data is embedded according to one of an asynchronous or synchronous positioning relative to the first audience measurement data.

5. The method of claim 1, wherein the embedding of the second audience measurement data includes forming a data set of frequency-domain data.

6. The method of claim 5, wherein the embedding of the second audience measurement data includes producing frequency-domain data based on the audience measurement data.

7. The method of claim 6, wherein the frequency domain data is processed to embed the audience measurement data as frequency components having predetermined frequencies.

8. The method of claim 6, wherein the frequency domain data is processed to embed code components of the audience measurement data according to a frequency-hopping pattern.

9. The method of claim 1, further including decoding the audio signal segment by forming and processing a data set therefrom to extract at least one of the first audience measurement data or the second audience measurement data.

10. A consumer electronics device, comprising:

an input to receive an audio signal segment in the device, the audio signal segment including first audience measurement data embedded in the audio signal segment;

a processor to embed second audience measurement data in the audio signal segment, the second audience measurement data being different from the first audience measurement data, the embedded first audience measurement data and the embedded second audience measurement data to exist in the audio signal segment simultaneously; and a speaker to reproduce the audio signal segment as sound.

11. The device according to claim 10, wherein the audio signal segment includes streaming media.

12. The device of claim 10, wherein the first audience measurement data and second audience measurement data include portions having frequency characteristics enabling separate detection of the first audience measurement data and the second audience measurement data.

13. The device of claim 10, wherein the processor is to embed the second audience measurement data according to one of an asynchronous or synchronous positioning relative to the first audience measurement data.

14. The device of claim 10, wherein the first audience measurement data and the second audience measurement data includes data sets of frequency domain data.

15. The device of claim 14, wherein the first audience measurement data and the second audience measurement data include frequency domain data.

16. The device of claim 15, wherein the processor is to process the frequency domain data to embed the second audience measurement data as frequency components having predetermined frequencies.

17. The device of claim 15, wherein the processor is to process the frequency domain data to embed code components of the audience measurement data according to a frequency-hopping pattern.

18. The device of claim 10, further including a decoder to decode the audio signal segment by forming and processing a data set therefrom to extract at least one of the first audience measurement data or the second audience measurement data.

19. A method comprising:

accessing an audio signal segment in a consumer electronics device capable of producing sound from the audio signal segment, the audio signal segment including first measurement data acoustically embedded into the audio signal segment;

acoustically embedding, with the consumer electronics device, second measurement data in the audio signal segment, the second measurement data being different from the first measurement data, and at least portions of the first measurement data and second measurement data existing in the audio signal segment simultaneously; and producing sound, via the consumer electronics device, based on the audio signal segment.

* * * * *